United States Patent [19]

Bosselaar et al.

[11] 4,148,053
[45] Apr. 3, 1979

[54] THYRISTOR CONTAINING CHANNEL STOPPER

[75] Inventors: Cornelis A. Bosselaar, Nijmegen, Netherlands; Alan Foster, Stockport, United Kingdom

[73] Assignee: U.S. Philips Corporation, New York, N.Y.

[21] Appl. No.: 859,688

[22] Filed: Dec. 12, 1977

Related U.S. Application Data

[63] Continuation of Ser. No. 662,427, Mar. 1, 1976, abandoned.

[30] Foreign Application Priority Data

Mar. 26, 1975 [GB] United Kingdom ............... 12648/75

[51] Int. Cl.² ............................................. H01L 29/74
[52] U.S. Cl. ........................................ 357/38; 357/50; 357/53; 357/55

[58] Field of Search ...................... 357/38, 39, 50, 52, 357/53, 55

[56] References Cited

U.S. PATENT DOCUMENTS

| 3,608,186 | 9/1971 | Hutson | 357/38 |
| 3,628,106 | 12/1971 | Frank et al. | 357/59 |
| 3,763,406 | 10/1973 | Bosslaar | 357/53 |
| 3,911,471 | 10/1975 | Kooi et al. | 357/50 |

Primary Examiner—Stanley D. Miller, Jr.
Assistant Examiner—James W. Davie
Attorney, Agent, or Firm—Thomas A. Briody

[57] ABSTRACT

High voltage thyristors (including triacs) in which the forward and reverse blocking junctions are terminated in passivating material in separate moats in the same major surface of the body and a channel stopper region is present between the moats. Annular field-relief electrodes can be added to the structure.

6 Claims, 7 Drawing Figures

THYRISTOR CONTAINING CHANNEL STOPPER

This is a continuation, of application Ser. No. 662,427, filed Mar. 1, 1976, abandoned.

This invention relates to a thyristor comprising at least four successive regions of alternating conductivity types arranged in a semiconductor body between first and second opposite major surfaces of the body, which four regions comprise first and second surface-layer regions of one conductivity type which adjoin respectively the first and second major surfaces of the body, a third inner-layer region which separates the first and second regions, is of the opposite conductivity type and forms first and second p-n junctions respectively with the first and second regions, and a fourth surface region which is provided in said first region adjacent the first major surface, is of said opposite conductivity type and forms a third p-n junction with said first region.

A first annular moat is present in the first major surface of the body with passivating dielectric material in the first moat.

The first region is laterally bounded by the first annular moat to terminate the first p-n junction at the first moat where passivated by the dielectric material in the first moat.

A further region of the one conductivity type is present in the body, which further region laterally bounds the third region and merges with the second region, extending the second p-n junction towards the first major surface.

A thyristor of the kind described above is described in the British Patent 1314267.

There are various known forms of thyristor having various arrangements of their regions and electrode connections. A large percentage of thyristors at present manufactured are unidirectional gate-controlled devices in which the fourth and second regions are provided with main electrode connections at the first and second major surfaces respectively and the first region is provided with a gate electrode also at the first major surface; in this case the first junction blocks the forward voltage applied between the main electrodes, prior to the device being switched to a conductive mode by a proper gate signal; the second junction blocks peak inverse voltages applied in the reverse direction to the main electrodes. By omitting the gate electrode another form of thyristor can be formed which is switched by avalanche effects at the first junction rather than by a gate signal. A further form of thyristor is a triac which is a bi-directional gate-controlled thyristor. A triac has a fifth surface region of opposite conductivity type which is provided in said second region and this is also contacted at the second major surface by the main electrode contacting the second region.

In recent years there has been considerable activity in trying to manufacture from a common semiconductor wafer a plurality of thyristors capable of blocking high voltages. In particular, it has been proposed to terminate said first p-n junction at passivating dielectric material in a first moat etched in the first major surface of the body and to terminate said second junction at passivating dielectric material in a second moat which is etched in the second major surface, see for example U.S. Pat. No. 3,821,782 and U.K. Pat. No. 1,294,184.

U.K. patent specification No. 1,314,267 mentioned the advantage of using the said further region to extend and terminate said second p-n junction at said first major surface.

However, the Applicants have found that terminating both the first and second p-n junctions at the same moat in said first major surface can seriously limit the maximum breakdown voltages that can be reliably obtained for blocking junctions of such mass-produced thyristors. In practice an imperfect interface is obtained between the semiconductor and the dielectric material in the moat. Since the first and second junctions terminate in the same moat, the same interface is swept both by the depletion layer formed at the first blocking junction when the device is forward biased between the main electrodes and by the depletion layer formed at the second blocking junction with reverse bias between the main electrodes. The Applicants have found that this leads to shorting of the first and second junctions at high voltages, for example voltages of at least 900 volts. This shorting appears to be due to the formation of p-type conductive channel adjacent the dielectric/semiconductor interface where swept by both depletion layers. In addition, a high resistivity is desired for said third inner-layer region to produce devices with high voltage blocking capabilities. However, the higher the resistivity, the greater is the tendency for a p-type channel to form adjacent the dielectric/semiconductor interface. Furthermore, due to sensitivity of charge-states at this interface leakage currents across the junctions are frequently found to increase slowly under voltages stress, particularly at higher temperatures (e.g. 125° C.); this instability also worsens with high resistivity.

According to the present invention a thyristor as described in the preamble is characterized in that a second annular moat with passivating dielectric material in said second moat is present in the first major surface of the body, the second annular moat extending around the first annular moat, the second p-n junction terminating at the second moat where it is passivated by the dielectric material in the second moat and a highly-doped surface region of such opposite conductivity type is present at the surface between the first and second moats to form a channel stopper located between and spaced from the terminations of the first and second p-n junctions at the first and second moats.

Using a double moat and channel-stopper arrangement according to the invention it is possible to produce from a common semiconductor wafer a plurality of thyristors capable of blocking voltages well in excess of 1,000 volts, while maintaining the advantages of passivating and terminating said first and second junctions adjacent the same major surface of the body. Blocking voltage capabilities of at least 1,500 volts can be achieved. Higher resistivities (for example approximately 50 ohm-cm. or more) can be used for the third region. In addition, if so desired, the channel-stopper region and said further and first regions can be provided readily with field-relief electrodes which extend over part of the dielectric material in the moats to permit operation at even higher voltages, for example at least 2,000 volts.

It should be noted that channel-stopper regions and field-relief electrodes are well-known per se in the bipolar transistor art. However, the use of channel stopper regions and field relief electrodes in that context is not concerned with the problem of the depletion layers of two such high-voltage blocking junctions of the device sweeping the same dielectric/semiconductor interface under opposed bias conditions, nor with the problem of terminating both these blocking junctions at a moat in the semiconductor surface. In devices in accordance with the present invention the depletion layer formed at the first blocking junction (when the device is biased in one direction) sweeps the dielectric/semiconductor interface at the first moat, and the depletion layer formed at the second blocking junction (when the device is biased in the opposite direction) sweeps the dielectric/semiconductor interface at the second moat. Furthermore, by providing the channel-stopper region between the first and second moats the manufacture of the device is not unduly complicated compared with for example the problems which would be encountered (in for example photolithography) if attempts were made to provide the channel-stopper region at the bottom of a common moat for the first and second junctions since such moats are typically deeper than 50 microns.

Embodiments of the present invention will now be described with reference to the accompanying diagrammatic drawings, in which.

Figure 1:
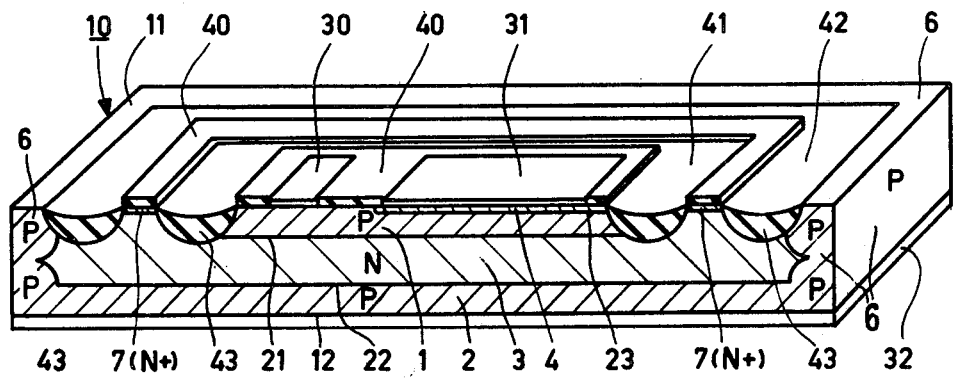
FIG. 1 is a part-sectional, part-perspective view of one thyristor element in accordance with the present invention.

The device of FIG. 1 is a gate-controlled thyristor comprising four successive regions 4, 1, 3 and 2 of alternating conductivity types arranged in a monocrystalline semiconductor body 10 between first and second opposite major surfaces 11 and 12 of the body 10. These four regions comprise first and second surface-layer regions 1 and 2 of p-type conductivity which adjoin respectively the first and second major surfaces 11 and 12, a third inner-layer region 3 which separates the regions 1 and 2, and a fourth surface region 4 which is provided in the region 1 adjacent the surface 11. The third region 3 is of an n-type conductivity and forms first and second p-n junctions 21 and 22 respectively with the first and second regions 1 and 2. The fourth region 4 is also of n-type conductivity and forms a third p-n junction 23 with the first region 1. In this device, the regions 1 and 3 are p-type and n-type bases respectively, and the regions 4 and 2 form n-type and p-type emitters which are provided with main electrodes 31 and 32 (cathode and anode) respectively. The p-type base 1 is provided with a gate electrode 30. The cathode and gate electrodes 31 and 30 are metal layers which contact the regions 4 and 1 at windows in an insulating layer 40 present at major surface 11 of the body 10. The whole of the second major surface 12 of the body 10 is metallised to form the electrode 32.

In the usual manner, the first junction 21 serves to block forward voltage applied between main electrodes 31 and 32 prior to the device being switched to a conductive mode by an appropriate signal on gate electrode 30. The second junction 22 must withstand peak inverse voltages applied between the main electrodes 31 and 32.

First and second annular moats 41 and 42 are present in the first major surface 11 of the body 10 with passivating dielectric material 43 in these moats. The second moat 42 extends around the first moat 41. The first region 1 is laterally bounded by the first moat 41, and the forward blocking junction 21 terminates at the inner periphery of the first moat 41 where passivated by dielectric 43. A further p-type region 6 laterally bounds the n-type base third region 3 and merges with the p-type second region 2 to extend the p-type region 2 towards the surface 11 and terminate the reverse blocking junction 22 at the outer periphery of the second moat 42 where passivated by dielectric 43. A highly-doped surface region 7 of the same conductivity type as the third region 3 (n-type) is provided in region 3 at the surface 11 between the first and second moats 41 and 42 to form a channel stopper located between and spaced from the terminations of the first and second blocking junctions 21 and 22 at the first and second moats 41 and 42.

The Applicants have produced such thyristors capable of blocking voltages of at least 1,500 volts applied between electrodes 31 and 32. By way of example typical values were a resistivity of 60 ohm-cm. for the n-type base region 3, acceptor surface concentrations of $5 \times 10^{19}$ dopant atoms/c.c. for regions 1 and 2, donor surface concentrations of $10^{21}$ dopant atoms/c.c. for regions 4 and 7, a thickness of 350 microns for wafer body 1, a depth and a width of 70 microns and 250 microns respectively for moats 41 and 42, and a spacing of 100 microns between the moats 41 and 42. The area bounded by the first moat 41 is determined by the geometry and dimensions of the required device.

These thyristors having such advantageous voltage blocking characteristics can nonetheless be mass-produced from common semiconductor wafers, as will now be described, by way of example, with reference to FIGS. 2 to 5. Corresponding device portions will be designated by the same reference numerals in the following Figures as in FIG. 1. Most of the processing techniques are already known in the art (see for example the previously mentioned U.K. and U.S. Patent Specifications) and will therefore only be described in outline.

Figure 2:
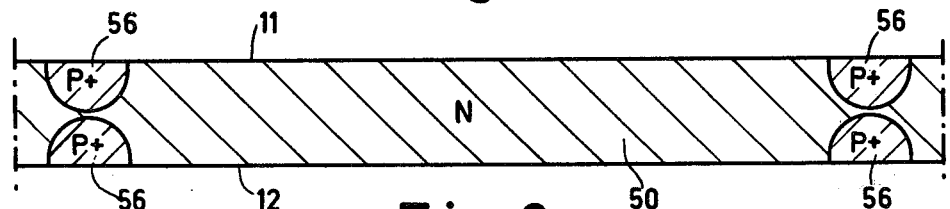
FIGS. 2 to 5 are cross-sectional views of part of a semiconductor wafer at various stages during the manufacture of such a thyristor.

The starting material is a monocrystalline silicon wafer 50 having n-type conductivity, a resistivity the same as that desired for region 3, a thickness determined by the desired thickness of the body or bodies 10, and a major surface area sufficient to permit the wafer 50 to form and be separated into body or bodies 10 of several thyristors. FIG. 2 shows only a portion of the wafer where one thyristor is to be formed, it being understood that similar thyristor elements are simultaneously provided in adjacent portions of the wafer 50. Generally a batch of wafers 50 are processed at the same time.

Acceptor dopant is selectively diffused into either or both major surfaces 11 and 12 of the wafer 50 in a grid pattern 56 for forming the region 6 which extends around the whole periphery of the thyristor bodies 1. This can be effected in known manner by selectively masking the surface 11 and/or 12 against diffusion by a masking layer pattern (for example of deposited silicon nitride) formed thereon. However, the grid pattern diffusion may be effected by diffusion from an aluminium grid pattern formed on the semiconductor surface; such aluminium diffusion from a localised solid source is described and claimed in our U.S. Pat. No. 4,040,878 and its contents are hereby incorporated into the present Specification. FIG. 2 shows by way of example the grid pattern 56 diffused from both surfaces 11 and 12.

Figure 3:
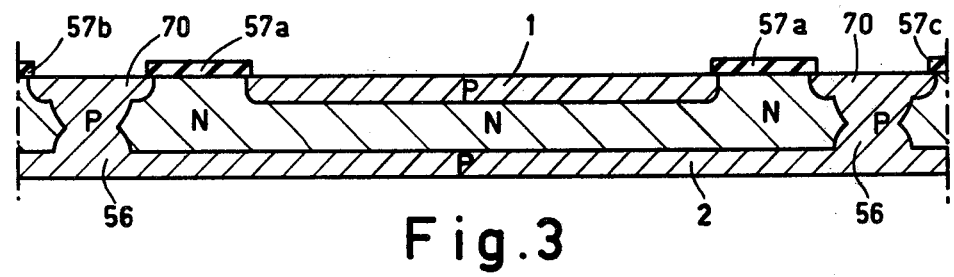

The surfaces 11 and 12 are re-exposed after this p-type grid diffusion, and then annular masking layer patterns 57a, 57b, 57c etc. (for example of thermally-grown silicon oxide) are formed photolithographically at parts of the surface 11 where the annular moats 41 and 42 are to be spaced, within the p-type grids 56. Using these layer patterns as a diffusion mask, a further acceptor dopant (for example boron) is diffused into surfaces 11 and 12 for forming p-type regions 1 and 2. During this diffusion, the p-type grid pattern 56 diffuses further to form a continuous p-type grid pattern 56 extending through the thickness of wafer 50 to extend towards surface 11 the p-type region 2 adjacent surface 12, as shown in FIG. 3.

Figure 4:
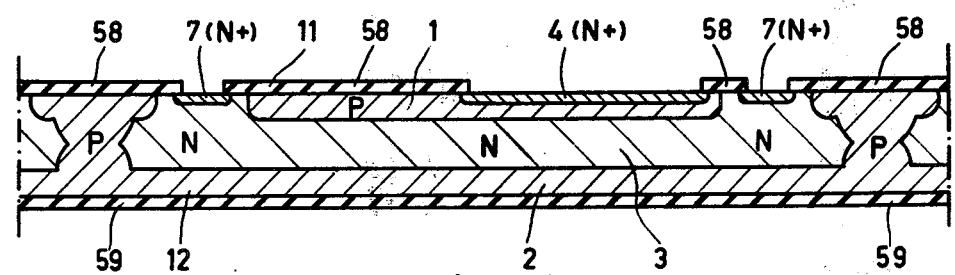

After using known techniques to remove the glass layer formed during this last diffusion and to clean the surfaces 11 and 12, further masking layers 58 and 59 (for example of thermally-grown silicon oxide) are formed at surface 11 and 12 respectively. The layer 59 covers the whole of surface 12. By known photolithographic and etching techniques the layer 58 is apertured with windows for forming region 4 in region 1, and these windows are surrounded by further, annular windows for forming the annular regions 7 in the annular portion of region 3 which adjoins surface 11 between the p-type region 1 and the p-type grid 56. Using these layers 58 and 59 as a diffusion mask, donor dopant (for example phosphorus) is diffused into the wafer 50 at said windows to form the regions 4 and 7 as shown in FIG. 4. During this diffusion glass is formed over the layer 58 and at the windows therein so forming an insulating layer 40 which covers the surface 11.

Figure 5:
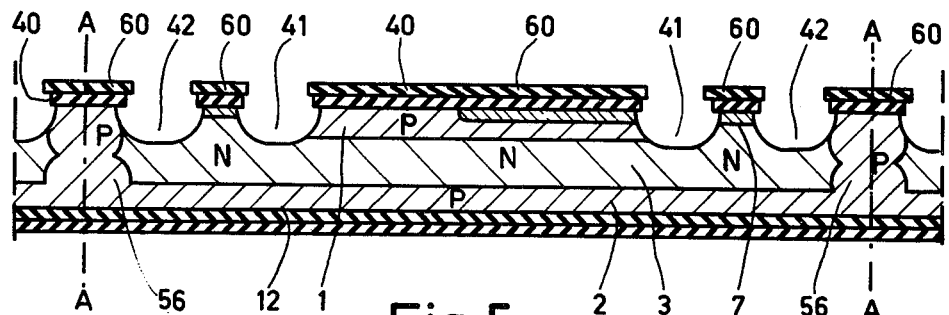

Subsequently a photoresist mask 60 is formed on the insulating layer 40 on surface 11 using known photolithographic techniques. This mask 60 has concentric annular windows where the inner and outer moats 41 and 42 are to be formed. Typically these windows 41 and 42 are for example 200 microns wide and spaced by 150 microns. The back surface 12 of the wafer is also suitably masked, for example with photoresist. The wafer 50 so masked is then immersed in known etchant solutions to form the moats 41 and 42 in the silicon wafer, as shown in FIG. 5.

Subsequently, dielectric material 43 is provided in known manner in the moats 41 and 42. The material 43 may be for example a glass such as is commercially available under the Trade Mark INNOTECH IP 820. Prior to firing, the glass may be deposited by electrophoresis or, for example, it may be deposited in two stages, firstly by sedimentation and secondly by blading across surface 11.

After firing, cathode and gate contact windows to regions 4 and 1 are etched in the layer 40, and the part of the layer 40 over the p-type grid pattern 56 is also removed to facilitate the subsequent separation of the wafer 50 into individual thyristor body or bodies 10. In known manner, the surface 12 is metallized to form the anode electrode 32, and the gate and cathode metal layer electrodes 30 and 31 are formed at surface 11. Subsequently the wafer 50 is divided through the p-type grid pattern 56 along line A—A in FIG. 5 to form the individual thyristor body or bodies 10. This division can be effected in known manner for example by scribing and cracking, by sawing, or by laser scribing.

Figure 6:
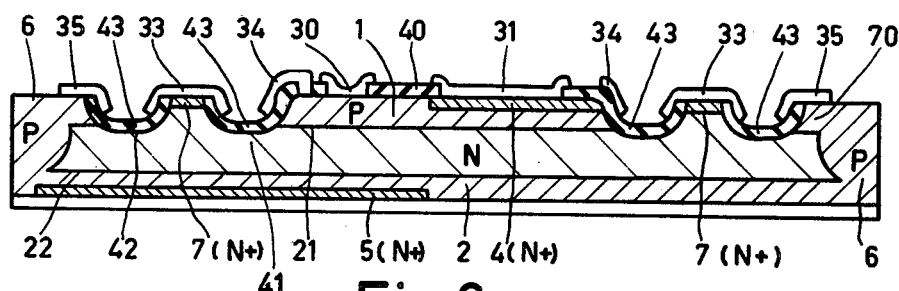
FIG. 6 is a cross-sectional view of a triac element in accordance with the present invention.
Figure 7:
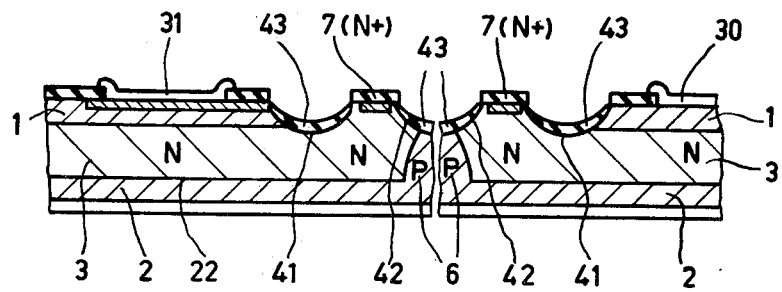
FIG. 7 is a cross-sectional view of adjacent parts of further thyristor elements in accordance with the present invention as they would appear immediately after separation from a common semiconductor wafer.

It will be evident that many modifications are possible within the scope of the invention, and some of these are illustrated in the arrangements of FIGS. 6 and 7. Thus, for example, the thyristor may be a bidirectional gate-controlled device, commonly called a triac and having a fifth region 5 which is of opposite conductivity type to region 2 and is provided in known triac configuration in region 2. This region 5 may be formed simultaneously with regions 4 and 7 by opening a window in masking layer 59 for the donor dopant diffusion.

Another important modification is that both the highly-doped channel-stopper region 7 and the p-type regions 1 and 2 can be provided with annular field-relief electrodes 33, 34 and 35 respectively extending on the dielectric material 43, for example as also shown in FIG. 6. Generally speaking, the channel-stopper region 7 serves to locally interrupt by its high doping any p-type channels formed in the portion of the n-type region 3 between the terminations of the first and second junctions 21 and 22, whereas field-relief electrodes by their potential applied to the dielectric material 43 tend to stabilize the dielectric while electrodes 34 and 35 serve to control the curvature of the depletion layers of junctions 21 and 22 when reverse-biased, and electrode 33 serves to control the lateral spread of the depletion layers and the possible p-type channel. By additionally providing such field-relief electrodes even higher breakdown voltages can be reliably achieved for junctions 21 and 22, for example at least 2,000 volts. These field-relief electrodes can be provided in a simple manner by changing the patterns used to define the insulting layer 40 where region 1 adjoins moat 41. The concentric annular electrodes 33, 34 and 35 can be formed simultaneously with electrodes 30 and 31 from a common metal layer in the same photolithographic and etching step. Electrode 33 contacts the channel-stopper region 7 and extends laterally over glass 43 beyond region 7 and around the whole inner periphery of the moat 42 and the whole outer periphery of moat 41. Electrode 34 contacts the p-type region 21 and extends over glass 43 around the whole inner periphery of moat 41 and beyond the termination of junction 21 at moat 41. Electrode 35 is connected to the further region 6 and extends over glass 43 around the whole outer periphery of moat 42 and beyond the termination of junction 22 at moat 42. Typically the electrodes 33, 34 and 35 may extend 50 microns over the glass 43.

By way of example, FIG. 6 illustrates formation of region 6 by diffusion of the grid pattern 56 from surface 11 (as previously described) until it merges with region 2. In FIG. 1, the region 6 adjoins the moat 42 which is advantageous for space-saving; in that case, if desired the annular window in the mask 57 of FIG. 3 above the grid pattern 56 may be omitted. However, if this window is provided, the moat 42 can be spaced from region 6, and the p-type layer portion 70 formed by the diffusion at this window (as shown in FIG. 3) can be used to terminate the second p-n junction 22 at the moat 42, as shown in FIG. 6. This use of the further p-type layer portion 70 serves to further space the terminations of junction 22 from the periphery of body 1.

When the highly-doped channel-stopper region 7 adjoins the moats 41 and 42, a space-saving advantage can result. However, as shown in FIG. 7, the region 7 may be spaced from the moats 41 and 42. Although it is usually more convenient to provide the region 7 in the same diffusion as the cathode region 4, a separate dopant diffusion could be used, if so desired.

In the thyristors of FIGS. 1 and 6, the outer moat 42 has an outer periphery spaced from the edge of the body and the second p-n junction 22 terminates at the glass 43 in this moat 42. This permits the wafer 50 to be divided through the p-type grid pattern 56 at a distance from the glass 43, and facilitates the provision of field-relief electrode 35 if such an electrode is desired. However, it is possible for the outer periphery of the outer moat 42 to be located at the bottom of the moat 42 and terminate in the periphery of the semiconductor body or bodies 10. Such an arrangement is shown in FIG. 7 where the region 6 adjoins the bottom of the moat 42 and terminates the p-n junction 22 at the moat bottom. Such a feature can result in a shallower diffusion to form region 6 (shown diffused from surface 12) and space-saving in that a common moat 42 can be etched in the wafer 50 between adjacent thyristor elements. However compared with FIGS. 1 and 6, the arrangement of FIG. 7 has the disadvantage that it will usually be necessary to saw or laser-scribe the wafer through the glass in moat 42; this can lead to cracking of the glass 43 which can reduce the effectiveness of the glass-passivation of the junction 22. For this reason it is usually preferable for the periphery of the body or bodies 10 to be spaced from the outer periphery of the outer moat 42, as in FIGS. 1 and 6.

It will be evident that the semiconductor devices of FIGS. 1, 6 and 7 can be manufactured using many different materials and compositions, and in particular that the conductivity types of all the various regions can be reversed to provide complementary-type devices in which regions 4, 7 and 3 (and 5, if present) are p-type and regions 1, 2 and 6 are n-type.

What is claimed is
1. A thyristor comprising:
   (a) a semiconductor body comprising first and second opposite major surfaces,
   (b) at least four successive regions of alternating conductivity types arranged in said semiconductor body between said first and second major surfaces, which four regions comprise first and second surface-layer regions of one conductivity type which adjoin, respectively, said first and second major surfaces of the body, a third inner-layer region which separates said first and second regions, is of opposite conductivity type and forms first and second p,n junctions with respectively said first and second regions, and a fourth surface region which is provided in said first region adjacent said first major surface, which fourth region is of said opposite conductivity type and forms a third p,n junction with said first region,
   (c) a first annular moat located in said first major surface of said body and containing passivating dielectric material therein, said first annular moat laterally bounding said first region and said first p,n junction terminating at said first moat and being passivated by said dielectric material in said first moat,
   (d) a further region of said one conductivity type laterally bounding said third region and merging with said second region to extend said second p,n junction toward said first major surface,
   (e) a second annular moat located in said first major surface of said body, said second moat having an outer periphery spaced from the periphery of the body, the second annular moat extending around said first annular moat and containing passivating dielectric material therein, said second p,n junction terminating at the dielectric material at the outer periphery of said second moat and being passivated by said dielectric material in said second moat,
   (f) a highly-doped surface region of said opposite conductivity type located at said first major surface between said first and second moats to form a channel stopper located between and spaced from the terminations of said first and second p,n junctions at, respectively, said first and second moats,
   (g) a control electrode connected to said first region and located at said first surface,
   (h) a first electrode connected to said fourth region and located at said first surface, and
   (i) a second electrode connected to said second region and located at said second surface.

2. A thyristor as in claim 1, comprising an electrode that contacts said highly-doped, channel-stopper region at said first major surface and extends laterally over the dielectric material at the inner periphery of said second moat and over the dielectric material at the outer periphery of said first moat, whereby said electrode serves as a field-relief electrode.

3. A thyristor as in claim 1, comprising a field-relief electrode that contacts said first region adjacent to said first moat and extends over said dielectric material at the inner periphery of said first moat and beyond the termination of said first p,n junction.

4. A thyristor as in claim 1, comprising a field-relief electrode located at said first major surface and connected to said further region of said one conductivity type, wherein said electrode extends over the dielectric material at the outer periphery of said second moat, and beyond the termination of said second p,n junction.

5. A thyristor as in claim 1, wherein said highly-doped, channel-stopper region extends laterally from the outer periphery of said first moat to the inner periphery of said second moat, and is provided in a portion of said third region which extends to said first major surface between said first and second moats.

6. A thyristor as in claim 1, wherein highly-doped, channel-stopper region has substantially the same doping concentration as said fourth region.

* * * * *